April 16, 1968 P. J. H. JANSSEN 3,378,784
AMPLIFYING CIRCUIT HAVING MEANS FOR REDUCING OPERATING VOLTAGE SOURCE HUM
Filed April 4, 1966
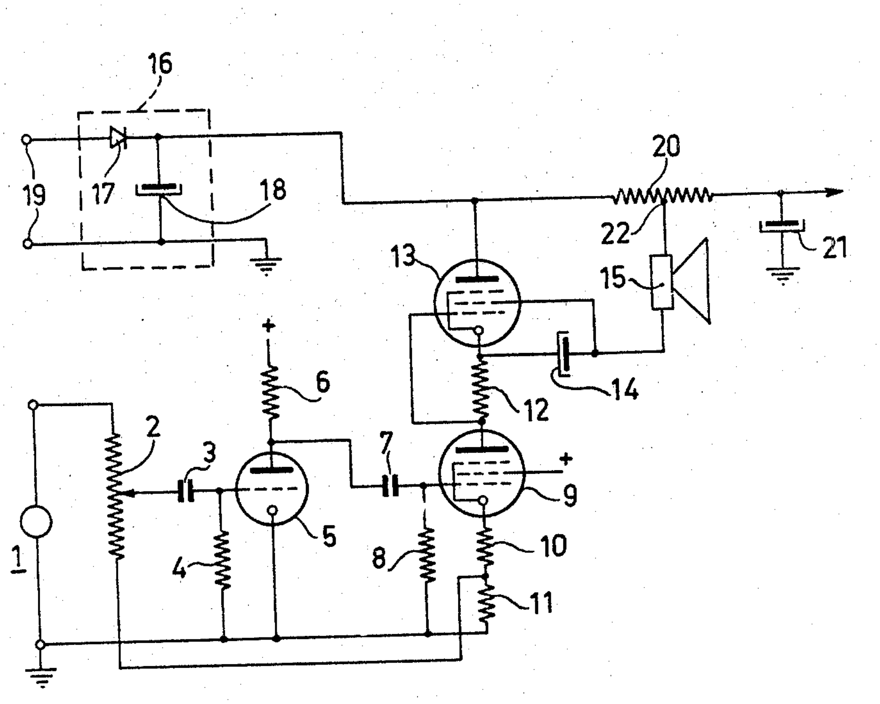
INVENTOR.
PETER J. H. JANSSEN
BY
Frank R. Trifari
AGENT

United States Patent Office 3,378,784

Patented Apr. 16, 1968

3,378,784
AMPLIFYING CIRCUIT HAVING MEANS FOR REDUCING OPERATING VOLTAGE SOURCE HUM

Peter Johannes Hubertus Janssen, Emmasingel, Eindhoven, Netherlands, assignor to North American Philips Company, Inc., New York, N.Y., a corporation of Delaware Filed Apr. 4, 1966, Ser. No. 539,941
Claims priority, application Netherlands, May 8, 1965, 65—5,865
5 Claims. (Cl. 330—70)

This invention relates to amplifying circuits comprising a first amplifying stage, the anode of which is connected through a resistor to one end of an alternating current load and a second amplifying stage the cathode lead of which is also connected to the said end of the alternating current load, whilst the control grid of the second stage is connected to the anode of the first amplifying stage and the anode of the second amplifying stage is connected to one end of a smoothing resistor included in the supply voltage lead and the other end of which is substantially decoupled by means of a smoothing capacitor.

Such amplifying circuits, which are known as "single-ended push-pull circuits," are often used as output amplifiers for an acoustic signal in which the said alternating current load comprises one or more loudspeakers. The signal voltage set up across the first-mentioned resistor serves as a control voltage for the second amplifying stage which is thus controlled in phase opposition to the first stage. The signal currents flowing through the stages together flow through the loudspeaker which fulfils the function of a load common to the two stages. So while the two stages are connected in series relative to the direct current, they are active as signal sources connected in parallel relative to the loudspeaker load. This results in an amplifying circuit having a comparatively low output impedance to which a loudspeaker, which invariably has a comparatively low impedance, may be connected without the interposition of an impedance transformer.

The amplifying circuit above described may advantageously be used in receiving circuits, for example, wireless or television receivers. The remaining portions of the receiver may be fed, for example, from the direct voltage set up across the said smoothing capacitor.

A high supply voltage has to be applied to the anode of the second amplifying stage, whilst also the direct current absorbed by the amplifying circuit is comparatively large. Several steps may be taken to avoid that the hum voltage present on the supply voltage may reach the loudspeaker through the internal resistance of the second amplifying stage.

A first method consists in that at least one smoothing network comprising an electrolytic smoothing capacitor and a smoothing resistor or a choke coil is included between the supply voltage rectifier and the anode of the second amplifying stage. The hum voltage appearing at the anode of the second stage may thus be reduced so as to be not audible or hardly in the loudspeaker. However, this method is expensive, whilst also the smoothing resistors and choke coils cause a direct voltage drop which brings about an undesirable reduction in the supply voltage for the amplifying circuit.

A second method may consist in that the hum voltage appearing at the anode of the second stage is also applied to one control electrode of the first stage and this with an amplitude and a polarity that no hum current flows through the loudspeaker. However, this method has the disadvantage that the compensation of hum greatly depends upon the tolerances of the first amplifying stage. Furthermore, it is often desirable to include in the amplifying circuit a variable negative feedback, for example, a negative feedback which is dependent upon frequency or dependent upon the volume control. In the last-mentioned method correct compensation of hum is impossible with such a variable negative feedback since the compensation of hum depends upon the negative feedback.

An object of the invention is to provide an amplifying circuit in which the above-mentioned disadvantages are obviated and, to this end, the amplifying circuit according to the invention is characterized in that the other end of the alternating current load is connected to a tap on the said smoothing resistor so that for the ratio between the resistance $R_2$ of the portion of the smoothing resistor located between the tap and that end to which the anode of the second amplifying stage is connected, and the resistance $R_1$ of the portion of the smoothing resistor located between the tap and that end to which the said smoothing capacitor is connected, there applies approximately:

$$\frac{R_2}{R_1}=\frac{R_{i_2}}{R_{i_1}}(1+SR)$$

where $R_{i_2}$ is the internal resistance of the second amplifying stage, $R_{i_1}$ is the internal resistance of the first amplifying stage, S is the mutual conductance of the second amplifying stage, and R is the value of the first-mentioned resistor.

A further advantage of the circuit according to the invention is that the loudspeaker current, in contrast with known circuits, does not completely flow through the smoothing capacitor to which the other portions of the receiver are connected but flows to a considerable proportion in the direction of the supply unit. More satisfactory uncoupling between the output amplifier and the remaining portions of the receiver is thus obtained so that the risk of low-frequency instability (motor-boating) is reduced.

It is to be noted that transistors may be used in the amplifying circuit according to the invention, the collector serving as the anode, the base as the control grid and the emitter as the cathode.

In order that the invention may be readily carried into effect, it will now be described in detail, by way of example, with reference to the accompanying diagrammatic drawing.

The figure shows a signal source 1 which provides the signal voltage to be amplified. This signal voltage is applied to a volume control 2. The signal derived from the sliding contact of the said volume control is applied through a coupling capacitor 3 and a grid resistor 4 to the control grid of a triode 5 which fulfills the function of a pre-amplifier. The anode lead of the triode 5 includes an anode resistor 6 through which the signal amplified by the triode 5 is derived. This signal is applied through a coupling capacitor 7 and a grid resistor 8 to the control grid of a pentode 9.

The cathode lead of the pentode 9 includes two resistors 10 and 11 connected in series, the common point of which is connected to the lower end of the volume control 2.

The anode of the pentode 9 is connected to the control grid of a pentode 13 and through a resistor 12 to the cathode thereof. A loudspeaker 15 is also connected to the said cathode through a high-value capacitor 14. The screen grid of the pentode 9 is connected to a positive voltage and the screen grid of the pentode 13 is connected to the common point of the capacitor 14 and the loudspeaker 15 so that the said screen grid is connected for alternating current to the cathode of the pentode 13 and receives the required positive direct voltage through the loudspeaker 15.

The figure also shows a supply portion 16 comprising a supply rectifier 17 and a first smoothing capacitor 18. This supply portion has applied to it through input terminals 19 an alternating voltage to be rectified, which is, for example, 220 volts and 50 c./s., whilst the direct voltage provided by the supply portion is passed on through a smoothing resistor 20 and a second smoothing capacitor 21 to feed several parts of the receiver such as, for example, the screen grid of the pentode 9 and the anode resistor 6 together with other parts not shown.

The positive direct voltage for the anode of the pentode 10 is derived from the connection between the first smoothing capacitor 18 and the smoothing resistor 20, whilst the loudspeaker 15 is connected to a top 22 on the resistor 20.

The circuit shown operates as follows:

The signal applied through the volume control 2 and the triode 5 to the control grid of the pentode 9 causes an alternating signal current in the anode circuit of pentode 9 which flows through the resistor 12 and the capacitor 14 to the loudspeaker. The signal voltage thus set up across the resistor 12 is applied to the control grid of the pentode 13 so that this tube is controlled in phase opposition to the pentode 9. The signal current provided by the pentode 13 also flows through the capacitor 14 to the loudspeaker 15. Since the two tubes 9 and 13 are controlled in phase opposition the two signal currents originating from the said tubes and flowing through the loudspeaker 15 are added together. Since the two tubes 9 and 13 thus fulfil the function of two signal sources connected in parallel relative to the loudspeaker 15 the output impedance of the amplifying circuit is low-ohmic enough to supply the maximum power to the loudspeaker without the interposition of an impedance transformer.

By connecting the lower end of the volume control 2 to the common point of the resistors 10 and 11 the circuit includes a negative feedback which depends upon the volume control and which operates as follows:

If the sliding contact is adjusted at the upper end of the volume control the complete signal voltage provided by the source 1 is applied to the control grid of the triode 5. The negative feedback is then substantially inactive since the negative feedback voltage originating from the resistor 11 is applied with considerable attenuation to the control grid of the triode 5 through the voltage divider constituted by the high-ohmic volume control 2 and the low-ohmic voltage source 1. On the other hand, if the sliding contact is adjusted at the lower end of the volume control, the voltage provided by the signal source 1 is considerably attenuated by the voltage divider constituted by the high-ohmic volume control and the low-ohmic resistor 11 and, furthermore, the negative feedback is then maximum since the complete negative feedback voltage originating from the resistor 11 is applied to the control grid of the tube 5.

By means of the negative feedback above described it is achieved that, with the volume control turned down, any residual signal penetrates the loudspeaker with great attenuation, whilst also the influence of hum voltages originating from the supply circuit and penetrating the amplifying circuit through the screen grid of pentode 9 and through the anode resistor 6 is suppressed considerably.

The direct supply voltage applied to the anode of the pentode 13 contains a considerable 50 c./s. hum voltage which also includes a large number of higher harmonics and is thus very interfering. To avoid the interfering influence of this hum voltage in the loudspeaker it is possible to include at least one smoothing network between the supply portion 16 and the feed point of the anode of the pentode 13. However, the circuit elements required therefor (electrolytic capacitors and possibly choke coils) are comparatively expensive. A much simpler solution for avoiding this interfering influence consists in connecting the loudspeaker 15 to the tap 22 on the smoothing resistor 20, the position of this tap being chosen correctly. As a matter of fact, two separate resistors can be used instead of the resistor 20 with its tap 22.

The above-described step for compensation of hum will be clarified more fully with reference to the following calculation.

V is the voltage present on the anode of the tube 13, $R_1$ is the resistance of the portion of the smoothing resistor 20 located between the tap 22 and the capacitor 21, and $R_2$ is the resistance of the portion of the smoothing resistor located between the tap 22 and the supply portion 16; the residual hum voltage present across the capacitor 21 can be neglected in the calculation.

A hum voltage $$V\frac{R_1}{R_1+R_2}$$

is thus set up between the tap 22 and earth and this hum voltage also exists between the cathode of tube 13 and earth. Consequently a hum current $$i_{a_1}=V\frac{R_1}{R_1+R_2}\,\frac{1}{R_{i_1}+R_{12}}$$

flows through the anode lead of the tube 9, where $R_{i_1}$ is the internal resistance of the tube 9. Since $R_{12}$ is small relative to $R_{i_1}$ it is possible to write for $i_{a_1}$:

$$i_{a_1}=V\frac{R_1}{R_1+R_2}\,\frac{1}{R_{i_1}} \qquad \text{(I)}$$

This current flows through the loudspeaker 15, the capacitor 14 and the resistor 12 to the anode of the tube 9, causing a hum voltage $V_{12}=i_{a_1}R_{12}$ across the resistor 12. This voltage also exists between the cathode and the control grid of the tube 13. Relative to the cathode a hum voltage $-V_{12}=-i_{a_1}R_{12}$ thus appears at the control grid of tube 13, this voltage causing the flow of a hum current $-SV_{12}=-i_aSR_{12}$ through it, where S is the mutual conductance of the tube 13.

A hum current also flows through the tube 13 due to the hum voltage which exists between the anode and the cathode of this tube. This voltage, which is equal to the hum voltage present between the anode of tube 13 and the tap 22, is:

$$V\frac{R_1}{R_1+R_2}$$

and causes the flow of a hum current $$V\frac{R_2}{R_1+R_2}\,\frac{1}{R_{i_2}}$$

through the tube 13, where $R_{i_2}$ is the internal resistance of tube 13.

Consequently the total hum current $i_{a_2}$ flowing through the tube 13 is:

$$i_{a_2}=V\frac{R_2}{R_1+R_2}\,\frac{1}{R_{i_2}}-i_{a_1}SR_{12}$$

which expression with (I) changes to:

$$i_{a_2}=V\frac{R_2}{R_1+R_2}\,\frac{1}{R_{i_2}}-V\frac{R_1}{R_1+R_2}\,\frac{1}{R_{i_1}}SR_{12} \qquad \text{(II)}$$

This current also flows, as $i_{a_1}$, through the capacitor 14 and the loudspeaker 15 but in opposite direction to $i_{a_1}$. It is therefore possible to avoid hum current in the loudspeaker by choosing $i_{a_2}=i_{a_1}$. From the Equations I and II it follows that this is the case if:

$$V\frac{R_2}{R_1+R_2}\,\frac{1}{R_{i_2}}-V\frac{R_1}{R_1+R_2}\,\frac{1}{R_{i_1}}SR_{12}=V\frac{R_1}{R_1+R_2}\,\frac{1}{R_{i_1}}$$

or $$\frac{R_2}{R_{i_2}}-\frac{R_1}{R_{i_1}}SR_{12}=\frac{R_1}{R_{i_1}}$$

or $$\frac{R_2}{R_{i_2}}=\frac{R_1}{R_{i_1}}(1+SR_{12})$$

or $$\frac{R_2}{R_1}=\frac{R_{i_2}}{R_{i_1}}(1+SR_{12}) \qquad \text{(III)}$$

The hum in the loudspeaker 15 may therefore be avoided completely by correct choice of the ratio $R_2/R_1$, that is to say of the position of the tap 22 on the resistor 20.

In a circuit realized in practice there applied:

$R_{i_2}=16$ KΩ,
$R_{i_1}=48$ KΩ,
$R_{12}=56$Ω,
$S=8.7$ ma./volt from which, according to (III), there follows for $$\frac{R_2}{R_1}:\frac{R_2}{R_1}\approx\frac{1}{2}$$

A further advantage of the illustrated circuit is that the signal current flowing through the loudspeaker 15 leaks away to earth only in part through the right-hand portion of the resistor 20 and the capacitor 21. With the proportioning above specified, only ⅓ part of the signal current flows through the capacitor 21 and the remaining ⅔ part flow through the left-hand portion of the resistor 20 and the capacitor 18 to earth. Consequently, an interference voltage originating from the signal current appears across the capacitor 21 which interference voltage is much smaller than in conventional circuits wherein the loudspeaker is directly connected to the capacitor 21, so that the risk of low-frequency negative feedback through the remaining amplifying stages connected to the capacitor 21 is greatly reduced.

Another important advantage is that the described method of hum compensation, in contrast with other methods of hum compensation, is independent of the negative feedback which varies with the position of the volume control. The compensation of hum is therefore optimum at any position of the volume control. This is due to the fact that the hum current $i_{a1}$ flowing in the anode circuit of the tube 9 because of the hum voltage V does not flow in the cathode lead of this tube. If, due to the hum voltage V, the anode voltage of the tube 9, and hence its anode current, increases the screen grid current of this tube equally increases and also, if the anode current decreases, the screen grid current equally increases. The negative feedback voltage set up across the cathode resistor 11 is therefore independent of the hum voltage V so that the negative feedback, which varies with the volume control, does not affect the compensation of hum.

For the same reason a negative feedback which depends upon frequency does not affect the hum compensation which is thus optimum for any frequency present in the hum voltage.

What is claimed is:

1. An amplifying circuit comprising first and second amplifier devices each having an input electrode, an output electrode and a common electrode, a source of direct voltage having first and second terminals, means connecting the common electrode of said first device to said first terminal, a source of signals connected to the input electrode of said first device, means connecting the input electrode of said second device to the output electrode of said first device, first resistor means connected between the output electrode of said first device and the common electrode of said second device, means connecting the output electrode of said second device to said second terminal, second resistor means having one end connected to said second terminal, third resistor means having one end connected to the other end of said second resistor means, capacitor means, means connecting said capacitor means between the other end of said third resistor means and said first terminal, and load circuit means and capacitor means serially connected between the common electrode of said second device and the junction of said second and third resistor means, the ratio of resistances of said second and third resistor means being substantially equal to:

$$\frac{R_{i_2}}{R_{i_1}}(1+SR)$$

wherein $R_{i_2}$ and $R_{i_1}$ are the internal resistances of said second and first devices respectively, S is the mutual conductance of said second device, and R is the resistance of said first resistor.

2. Means for reducing operating voltage source hum in an amplifying system of the type having a source of operating voltage with first and second terminals, means for dropping the voltage of said source for providing a direct voltage of lower magnitude comprising dropping resistor means having one end connected to said second terminal and capacitor means connected between the other end of said dropping resistor and said first terminal, an output amplifying stage having first and second amplifier devices with their operating current paths serially connected between said first and second terminals in that order, a first resistor connected between the operating current paths of said devices, and a series output circuit of a capacitor and load means having one end connected to the junction of said first resistor and second device, said means for reducing hum comprising a tap on said dropping resistor means, and means connecting the other end of said series output circuit to said tap, the position of said tap being substantially determined by the relationship:

$$\frac{R_2}{R_1}=\frac{R_{i_2}}{R_{i_1}}(1+SR)$$

wherein $R_2$ is the resistance of said dropping resistor means between said second terminal and tap, $R_1$ is the resistance of the remainder of said dropping resistor means, $R_{i_1}$ and $R_{i_2}$ are the internal resistances of said first and second devices respectively, S is the mutual conductance of said second device, and R is the resistance of said first resistor.

3. An output amplifying stage for an amplifier system of the type having a source of operating voltage with first and second terminals, and means for dropping the voltage of said source for providing a direct voltage of lower magnitude comprising dropping resistor means having one end connected to said second terminal and capacitor means connected between the other end of said dropping resistor means and said first terminal, said amplifying stage comprising a first electron discharge device having a first control grid, a first cathode and a first anode, a second electron discharge device having a second control grid, a second cathode and a second anode, a source of signals, means connecting said source to said first control grid, means connecting said first cathode to said first terminal, means connecting said second control grid to said first anode, a first resistor connected between said first anode and second cathode, means connecting said second anode to said second terminal, an output circuit comprising a series connected capacitor and load means, a tap on said dropping resistor means, and means connecting said output circuit between said tap and said second cathode, the position of said tap being substantially determined by the relationship:

$$\frac{R_2}{R_1}=\frac{R_{i_2}}{R_{i_1}}(1+SR)$$

wherein $R_2$ is the resistance of said dropping resistor means between said second terminal and tap, $R_1$ is the resistance of the remainder of said dropping resistor means, $R_{i_1}$ and $R_{i_2}$ are the internal resistances of said first and second devices respectively, S is the mutual conductance of said second device, and R is the resistance of said first resistor.

4. The amplifying stage of claim 3, in which said second device has a screen grid, and one end of the capacitor of said output is connected to said second cathode, comprising means connecting said screen grid to the other end of said capacitor.

5. The amplifying stage of claim 3, in which said means connecting said source to said first control grid comprises a third electron discharge device having a third control grid, a third cathode and a third anode, and said means connecting said first cathode comprises series connected second and third resistors, comprising a potentiometer having one end connected to said source of signals, a tap connected to said third control grid, and the other end connected to the junction of said second and third resistors, means connecting said third cathode to said first terminal, and means connecting said third anode to said first control grid.

References Cited

UNITED STATES PATENTS 2,438,960 4/1948 Blitz ---------------- 330—70

ROY LAKE, *Primary Examiner.*

J. B. MULLINS, *Assistant Examiner.*